United States Patent
Oh et al.

(10) Patent No.: US 9,196,454 B2
(45) Date of Patent: Nov. 24, 2015

(54) MICRO-COLUMN WITH DOUBLE ALIGNER

(71) Applicant: Industry-University Cooperation Foundation Sunmoon University, Chungcheongnam-do (KR)

(72) Inventors: Tae Sik Oh, Chungcheongnam-do (KR); Ho Seob Kim, Incheon (KR); Dae Wook Kim, Gyeonggi-do (KR); Seung Joon Ahn, Daejeon (KR)

(73) Assignee: Industry-University Cooperation Foundation Sunmoon University, Chungcheongnam-do (KR)

( * ) Notice: Subject to any disclaimer, the term of this patent is extended or adjusted under 35 U.S.C. 154(b) by 0 days.

(21) Appl. No.: 14/184,931

(22) Filed: Feb. 20, 2014

(65) Prior Publication Data
US 2014/0239190 A1    Aug. 28, 2014

(30) Foreign Application Priority Data
Feb. 28, 2013    (KR) .................. 10-2013-0022157

(51) Int. Cl.
*G21K 5/04*    (2006.01)
*H01J 37/147*    (2006.01)

(52) U.S. Cl.
CPC ..... *H01J 37/1471* (2013.01); *H01J 2237/1205* (2013.01); *H01J 2237/1516* (2013.01)

(58) Field of Classification Search
CPC .................. H01J 1/00; H01J 1/46; H01J 1/50; H01J 3/14; H01J 3/16; H01J 3/18; H01J 3/20; H01J 3/22; H01J 3/26; H01J 29/46; H01J 29/52; H01J 29/56; H01J 29/58; H01J 29/62; H01J 29/64; H01J 29/70
USPC .................. 250/396 R, 397, 398, 396 ML
See application file for complete search history.

(56) References Cited

U.S. PATENT DOCUMENTS

2010/0200766 A1*  8/2010  Kim ..................... 250/396 R
2011/0079731 A1   4/2011  Kim

FOREIGN PATENT DOCUMENTS

KR    10-2011-0014589 A    2/2011

OTHER PUBLICATIONS

Office action dated Jan. 28, 2014 issued from Korean Intellectual Property Office in a counterpart Korean patent application.

* cited by examiner

*Primary Examiner* — Nicole Ippolito
(74) *Attorney, Agent, or Firm* — The PL Law Group, PLLC

(57) ABSTRACT

Disclosed herein is a microcolumn with a double aligner. The microcolumn is configured such that when an axis of an aperture of a limiting aperture is spaced apart from an original path of a particle beam, the path of the particle beam can be effectively compensated for in such a way that the path of the particle beam is aligned with the axis of the aperture of the limiting aperture by the double aligner. The microcolumn includes a source lens. The source lens includes at least two aligner layers which compensate for the path of the particle beam.

10 Claims, 9 Drawing Sheets

MICRO-COLUMN WITH DOUBLE ALIGNER

CROSS-REFERENCE TO RELATED APPLICATION AND CLAIM OF PRIORITY

This application claims the benefit of Korean Patent Application No. 10-2013-0022157, filed on Feb. 28, 2013, at the Korean Intellectual Property Office, the disclosures of which are incorporated herein in their entirety by reference.

BACKGROUND OF THE INVENTION

1. Field of the Invention

The present invention relates generally to microcolumns and, more particularly, to a microcolumn with a double aligner which is configured such that when an axis of an aperture of a limiting aperture is spaced apart from an original path of a particle beam, the path of the particle beam can be effectively compensated for in such a way that the path of the particle beam is aligned with the axis of the aperture of the limiting aperture by the double aligner.

2. Description of the Related Art

Generally, micro-particle beam columns (microcolumns) include a particle source (an emitting source) and electronic lenses which are operated using an electrostatic field and a magnetic field. The particle beam columns generate, focus and scan particle beams such as electron beams or ion beams. Electron columns using electron beams and ion beam columns using ion beams are examples of the particle beam columns. Such particle beam columns, particularly, electron columns, are used in an electron microscope, semiconductor lithography or in a variety of test devices, e.g., for checking a via hole/contact hole of a semiconductor device for defects, surface inspection and analysis of a specimen, mask inspection, for checking TFT (thin film transistor) wiring on a display device such as a TFT-LCD or an OLED, etc.

The electron column is a representative example of such a particle beam column. A micro-electron column which is an example of the electron columns for creating, focusing and scanning electron beams is manufactured based on an electron emitting source and a micro-electronic optical element that has an aperture having a diameter of 500 µm or less. Such a micro-electron column was introduced in 1980. The micro-electron column is an improved electron column in which fine elements are precisely assembled with each other to minimize optical aberration. By virtue of small size, a multiple electron column structure can be embodied in such a way that several micro-electron columns are arranged in parallel or in series. For this, a lens is manufactured using a silicone wafer through a semiconductor process, and an aperture portion of the lens is manufactured using a membrane through a microelectronic mechanical system (MEMS) process and may be used as an electrostatic lens.

FIG. 1 is a view illustrating the structure of a micro-electron column, showing an electron beam B irradiated into a particle emitting source (11, an electron emitting source), a source lens 12, a deflector 14 and a focus lens (15, an einzel lens) which are arranged in a row.

Typically, a microcolumn which is a representative example of the micro-electron column includes a particle emitting source (11, an electron emitting source) which emits electrons designated by the arrow, a source lens 12 which includes three electrode layers to emit, accelerate and control the electrons and forms an available electron beam using the emitted electrons, a deflector 14 which deflects the electron beam, and a focus lens (an einzel lens) 15 which focuses the electron beam on a specimen S. Generally, the deflector is disposed between the source lens and the einzel lens.

Typically, to operate the microcolumn, negative voltage (about −100 V to −2 kV) is applied to the particle emitting source (11, the electron emitting source), and appropriate voltages are applied to the electrode layers of the source lens 12. The einzel lens which is provided as an example of the focus lens 15 focuses the electron beam in such a way that external electrode layers which are disposed at opposite sides are earthed, and negative voltage (in a deceleration mode) or positive voltage (in an acceleration mode) is applied to an intermediate electrode layer. Based on the same operation distance, the level of focusing voltage of the deceleration mode is less than that of the acceleration mode. Synchronized deflecting voltage is applied to the deflector 14 to adjust the path of the electron beam and periodically apply the electron beam on the surface of the specimen. Controlling the electron beam, the electron lens such as the source lens or the focus lens includes at least two electrode layers each of which has in a central portion thereof an aperture having a circular shape or a predetermined shape so that the electron beam passes through the electrode layer. Typically, three electrode layers are used.

The micro-electron columns which have been illustrated as the representative electron beam column are classified into a singular micro-electron column which includes a single electron beam emitting source and electron lenses for controlling an electron beam emitted from the electron beam emitting source, and a multiple micro-electron column which includes electron lenses for controlling a plurality of electron beams emitted from a plurality of electron emitting sources. Multiple micro-electron columns are also classified into a wafer type micro-electron column which includes a particle beam emitting source having a plurality of particle beam emitting source tips provided on a single electrode layer such as a semiconductor wafer, and an electron lens in which a lens layer having a plurality of apertures is stacked on a single electrode layer, a combination micro-electron column in which a single lens layer having a plurality of apertures controls a particle beam that is emitted form each particle beam emitting source in the same manner as that of the single electron column, and an array type micro-electron column in which a plurality of single micro-electron columns are installed in a single housing. In the combination micro-electron column, only the particle beam emitting source is separately provided, but the lens can be used in the same manner as that of the wafer type micro-electron column.

In the microcolumn which is referred to as the particle beam column, a particle beam is generated from the particle beam source and is focused before scanning a specimen. Here, depending on the kind of specimen, a sample current method in which ions or electrons are detected may be used. In the sample current method, a conductive part of the sample is connected to the outside, and ions or electrons applied to the sample are directly detected so that the result can be directly checked from the outside. Such a sample current method can be used for checking a via hole/contact hole of a semiconductor device for defects, surface inspection and analysis of a specimen, for checking a TFT (thin film transistor) a TFT-LCD or an OLED for defects, etc.

However, the conventional microcolumn is problematic in that it may be partially deformed during a manufacturing process. Particularly, there is a difficulty in that the source lens into which particles emitted from the particle beam emitting source are first applied must precisely form the path of the particle beam to correctly focus the particle beam on the specimen S. That is, even when the emitted particle beam is injected into the source lens by the extractor of the source lens and is accelerated by the accelerator, if the path of the particle beam is not on the axis of the aperture of the limiting aperture, the particle beam cannot be correctly focused on the specimen. Particularly, because the aperture of the limiting aperture has a very small diameter, if the microcolumn including the limiting aperture and the source lens is incorrectly formed, it becomes difficult to apply the particle beam to the specimen.

If the application of the particle beam to the specimen is not correctly conducted, the operation efficiency of the microcolumn is reduced. In addition, the specimen is not precisely scanned. Therefore, the result of the inspection and analysis of the specimen is unreliable.

SUMMARY OF THE INVENTION

Accordingly, the present invention has been made keeping in mind the above problems occurring in the prior art, and an object of the present invention is to provide a microcolumn with a double aligner which is configured such that when an axis of an aperture of a limiting aperture is spaced apart from apart from an original path of a particle beam, the path of the particle beam can be effectively compensated for in such a way that the path of the particle beam is aligned with the axis of the aperture of the limiting aperture by the double aligner.

Another object of the present invention is to provide a microcolumn with a double aligner in which each double aligner layer of the double aligner includes plurality of aligner layer pieces, and individual voltage can be applied to each aligner layer piece so that compensation of the path of the particle beam can be facilitated.

A further object of the present invention is to provide a microcolumn with a double aligner which can more precisely compensate for the path of the particle beam in such a way that the particle beam is biased towards a compensated path by one of the double aligner layers and then aligned with the axis of the aperture by the other of the double aligner layers.

Yet another object of the present invention is to provide a microcolumn with a double aligner which is configured such that at least one of the extractor and the accelerator of the source lens may be formed of the aligner layer so that the double aligner layers not only compensate for the path of the particle beam but also function as the extractor or the accelerator.

In order to accomplish the above object, in an aspect, the present invention provides a microcolumn comprising a source lens, wherein the source lens comprises at least two aligner layers compensating for a path of a particle beam.

The source lens may include a limiting aperture having an aperture. The path of the particle beam may be compensated for by the at least two aligner layers so that the particle beam is moved into an aperture of the limiting aperture that has been misaligned from an axis of the path of the particle beam injected into the source lens.

The source lens may include an extractor and an accelerator, wherein at least one of the extractor and the accelerator of the source lens may be formed of the aligner layer.

The microcolumn may comprise a single microcolumn having: a particle beam emitting source; and a plurality of lenses controlling a particle beam, or a multi-microcolumn having: a plurality of particle beam emitting sources; and a plurality of lenses controlling a plurality of particle beams. The microcolumn may include: the source lens comprising the at least two aligner layers; a deflector scanning the particle beam; and a focus lens focusing the particle beam on a specimen.

In another aspect, the present invention provides a method for compensating for a path of a particle beam in a microcolumn having an aligner layer, the method including: applying the particle beam into a source lens comprising at least two aligner layers and a limiting aperture; biasing the particle beam towards an axis of a compensated path between an accelerator and the limiting aperture using a first aligner layer of the at least two aligner layers; and aligning the particle beam that has passed through the first aligner layer with an axis of an aperture of the limiting aperture using a second aligner layer of the at least two aligner layers.

A microcolumn with a double aligner according to the present invention is configured such that when an axis of an aperture of a limiting aperture is spaced apart from apart from an original path of a particle beam, the path of the particle beam is compensated for. The microcolumn can effectively compensate for the path of the particle beam in such a way that the path of the particle beam is aligned with the axis of the aperture of the limiting aperture by the double aligner.

The double aligner includes a plurality of aligner layer pieces, and individual voltage is applied to each aligner layer piece. Thereby, the operation of compensating for the path of the particle beam can be facilitated.

The microcolumn includes double aligner layers, so that compensation of the path of the particle beam can be more precisely conducted in such a way that the particle beam is biased towards a compensated path by one of the double aligner layers and then aligned with the axis of the aperture by the other of the double aligner layers.

At least one of the extractor and the accelerator of the source lens may be formed of the aligner layer. In this case, the double aligner layers not only compensate for the path of the particle beam but also function as the extractor or the accelerator.

The microcolumn with the double aligner reduces a spot size and increases current of the particle beam so that the degree with which the particle beam is focused on the specimen can be enhanced, whereby resolution can be increased.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Hereinafter, the present invention will be described in detail with reference to the attached drawings.

As shown in FIGS. 1 through 10, a microcolumn 10 with a double aligner according to the present invention includes a plurality of aligner layers which compensate for the path of a particle beam injected into the microcolumn. The path of the particle beam is compensated for by the aligner layers so that the particle beam can be appropriately focused on a specimen.

The microcolumn 10 is provided with a source lens 20. The source lens 20 includes the aligner layers which compensate for the path of a particle beam.

In the microcolumn 10 with the double aligner layer according to the present invention, the particle beam can be embodied by an electron beam or ion beam. In the following description, the case where the electron beam is used will be explained as a representative example. As well as such an example using the electron beam, an embodiment using an ion beam falls within the bounds of the present invention.

More preferably, in the microcolumn 10 according to present invention, the source lens 20 includes a limiting aperture 23. The microcolumn 10 is characterized in that the path of a particle beam is compensated for by the two or more aligner layers so that the particle beam can pass through an aperture 231 of the limiting aperture 23 that is misaligned from an axis along which the particle beam emitted from the source lens 20 travels.

Figure 1:
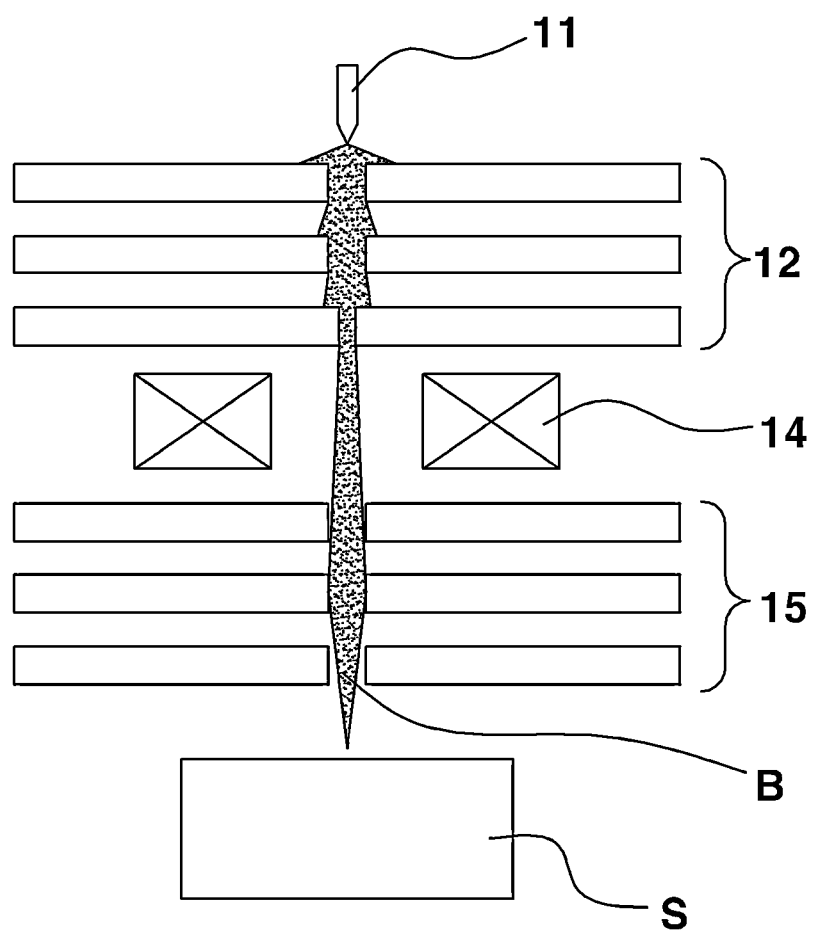
FIG. 1 is a sectional view showing a particle beam column according to a conventional technique.
Figure 2:
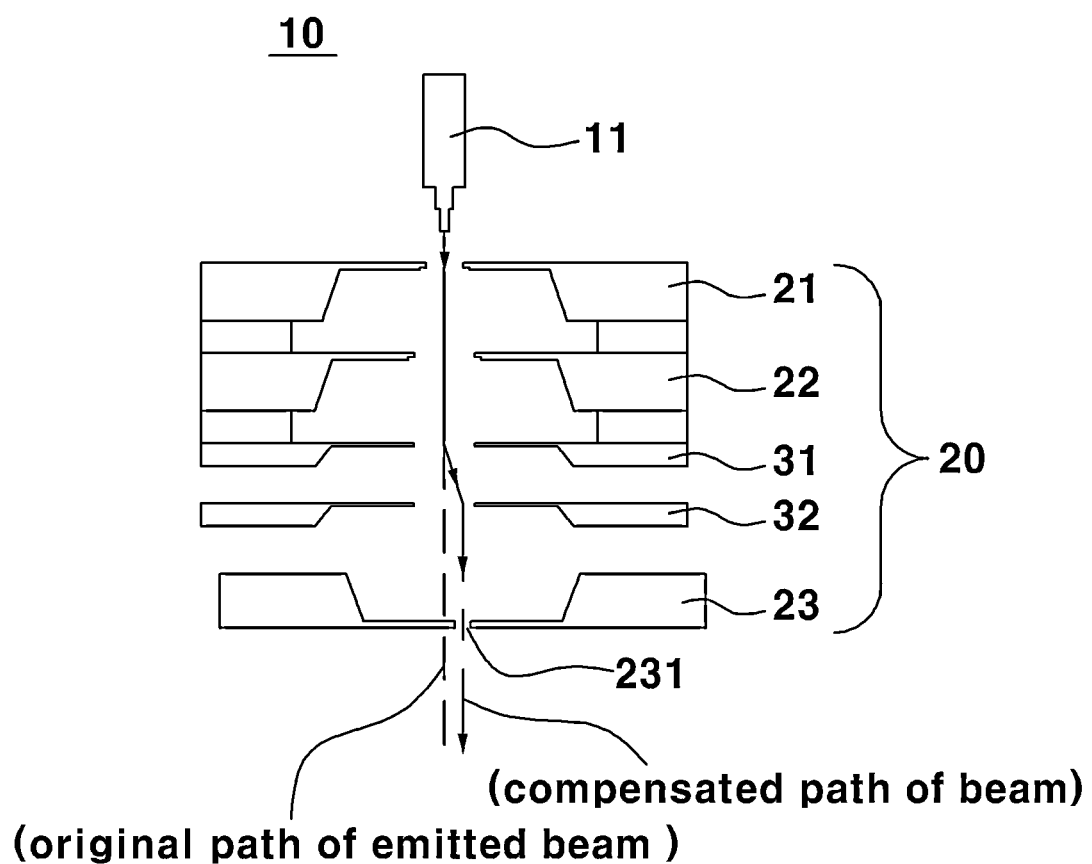
FIG. 2 is a sectional view illustrating a source lens of a particle beam column according to an embodiment of the present invention.
Figure 3:
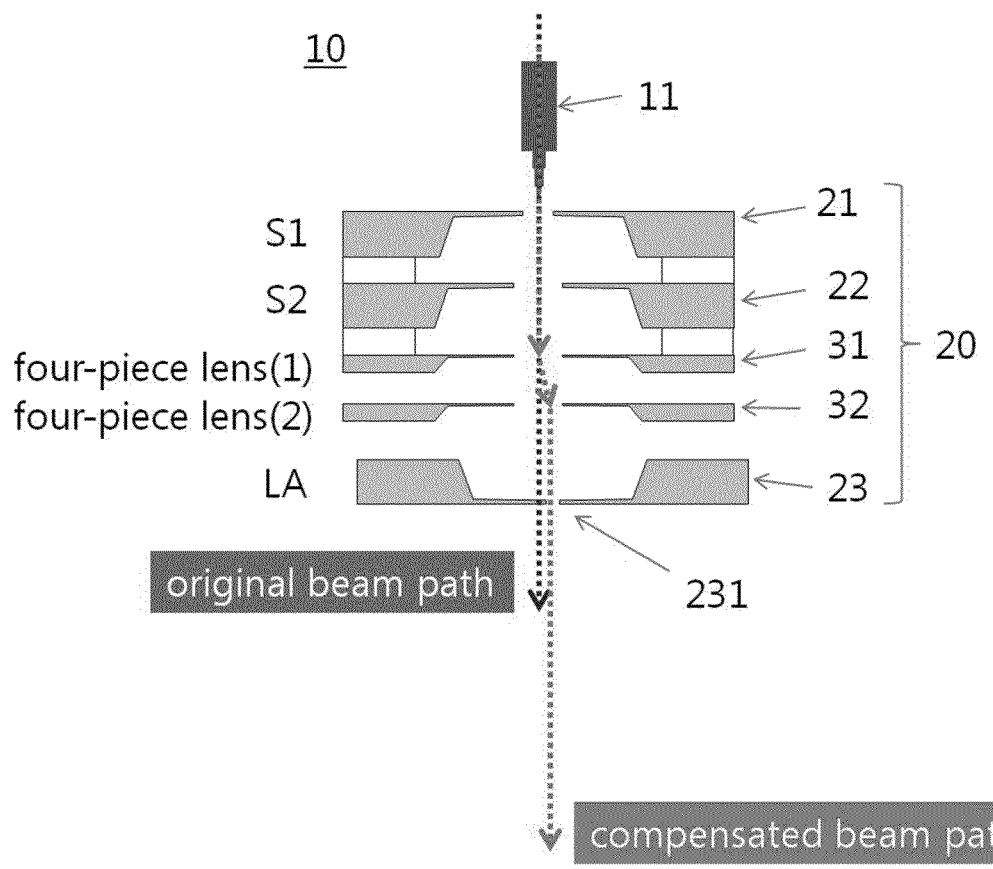
FIG. 3 is a view illustrating the flow of a particle beam that is determined by aligner layers in the source lens of the particle beam column according the present invention.

As shown in FIGS. 2 and 3, a center axis of the aperture 231 of the limiting aperture 23 may be undesirably displaced from the original path along which the particle beam emitted from the source lens 20 travels. Here, because the diameter of the aperture 231 of the limiting aperture 23 is comparatively small, if the axis of the aperture 231 of the limiting aperture 23 is not on the original path of the particle beam, the particle beam can no longer travel.

In this case, the path of particle beam is compensated by the two or more aligner layers, which are disposed before the limiting aperture 23 based on the path of the particle beam. This compensation operation will be explained with reference to FIGS. 2 and 3. The particle beam which is emitted from the particle beam emitting source 11 is injected into the source lens 20 through an extractor 21 of the source lens 20.

The particle beam is accelerated by an accelerator 22, and the accelerated particle beam enters the aperture 231 of the limiting aperture 23 which has a comparatively small diameter.

Here, the center axis of the aperture 231 of the limiting aperture 23 may be undesirably displaced from the original path of the particle beam injected into the source lens 20. In this case, the particle beam can no longer pass through the aperture 231 nor reach the specimen.

To prevent the above problem, in the present invention, the double aligner is provided before the limiting aperture 23 based on the path of the particle beam. Thus, the path of the particle beam is compensated for by the double aligner so that the particle beam can be moved into the aperture 231 of the limiting aperture 23.

In a preferred embodiment, the double aligner includes two aligner layers, as shown in FIGS. 2 and 3.

In more detail, the double aligner includes a first aligner layer 31 which is first brought into contact with the particle beam that enters the source lens 20, and a second aligner layer 32 which makes the particle beam be moved into the aperture 231 of the limiting aperture 23 that is misaligned from the original path of the particle beam.

The double aligner compensates for the path of the particle beam in such a way that the first aligner layer 31 biases the particle beam towards the axis of a compensated path along which the particle beam travels after being compensated, and the second aligner layer 32 forms the axis of the compensated path that is spaced apart from the axis of the original path of the particle beam injected into the source lens or is inclined with respect to the axis of the original path of the particle beam by a predetermined angle.

In this embodiment, although the double aligner has been illustrated as having two aligner layers, it may further include an additional aligner layer which is disposed between the first aligner layer 31 and the second aligner layer 32 to additionally compensate for the path of the particle beam.

Each aligner layer includes a plurality of aligner layer pieces. In other words, each of the first and second aligner layers 31 and 32 includes a plurality of aligner layer pieces. As shown in the drawings, the aligner layer pieces may form a multi-divided structure, for example, having four pieces or eight pieces.

The aligner layer pieces compensate for the direction of the path of the particle beam in response to voltages applied to the respective aligner layer pieces.

As shown in FIG. 4 through 8, for example, in the case where each of the double aligner layers includes four aligner layer pieces, the particle beam is compensated for in such a way that different voltages are respectively applied to the aligner layer pieces that are disposed at a side opposite to a direction desired to compensate for the particle beam. In other words, different voltages are respectively applied to the different aligner layer pieces. The particle beam is moved by the first aligner layer 31 in the direction desired to compensate for the particle beam. The particle beam is thereafter aligned by the second aligner layer 32 with the axis of the aperture 231 of the limiting aperture 23 that is spaced apart from the axis of the original path of the particle beam injected into the source lens 20. As a result, the particle beam can be moved through the aperture 231 of the limiting aperture 23.

In the embodiment shown in FIGS. 2 through 8, the source lens 20 includes the extractor 21, the accelerator 22, the limiting aperture 23 and the double aligner layers 31 and 32.

In an embodiment of the double aligner layers, at least one of the extractor 21 and the accelerator 22 of the source lens 20 may be formed of the aligner layer.

If one of the double aligner layers is embodied by the extractor 21 of the source lens 20, it makes the particle beam emitted from the particle beam emitting source 11 correctly enter the source lens 20 and be biased towards the compensated path. In this case, the extractor 21 also functions as the first aligner layer which moves the particle beam in the direction desired to compensate for it.

If one of the double aligner layers is embodied by the accelerator 22 of the source lens 20, it accelerates the particle beam and moves the beam towards the compensated path.

That is, the accelerator 22 also functions as the first aligner layer which moves the particle beam in the direction desired to compensate for it.

Alternatively, one of the double aligner layers may be embodied by the accelerator 22 to make the particle beam be accelerated and moved along the compensated path aligned with the axis of the aperture 231 of the limiting aperture 23. In this case, the accelerator 22 also functions as the second aligner layer which makes the particle beam be moved along the compensated path aligned with the axis of the aperture 231.

In the case where the accelerator 22 also functions as the second aligner layer, the first aligner layer that biases the particle beam towards the compensated path is disposed before the accelerator 22 on an end of the original path of the particle beam that is adjacent to the particle beam emitting source 11. The first aligner layer may be separately provided or, alternatively, the extractor 21 may function as the first aligner layer.

As shown in FIG. 3, when the particle beam enters the source lens 20 which includes the extractor 21 (S1), the accelerator 22 (S2), the first aligner layer 31 (the first four-piece lens), the second aligner layer 32 (the second four-piece lens) and the limiting aperture 23 (LA), the original path of the particle beam (referred to as 'original beam' of FIG. 3) is blocked by the limiting aperture 23. The double aligner which includes the first aligner layer 31 and the second aligner layer 32 compensates for the path of particle beam and aligns it with the axis of the aperture 231 of the limiting aperture 23. Thereby, the particle beam enters the aperture 231 and then is focused on the specimen.

Figure 9:
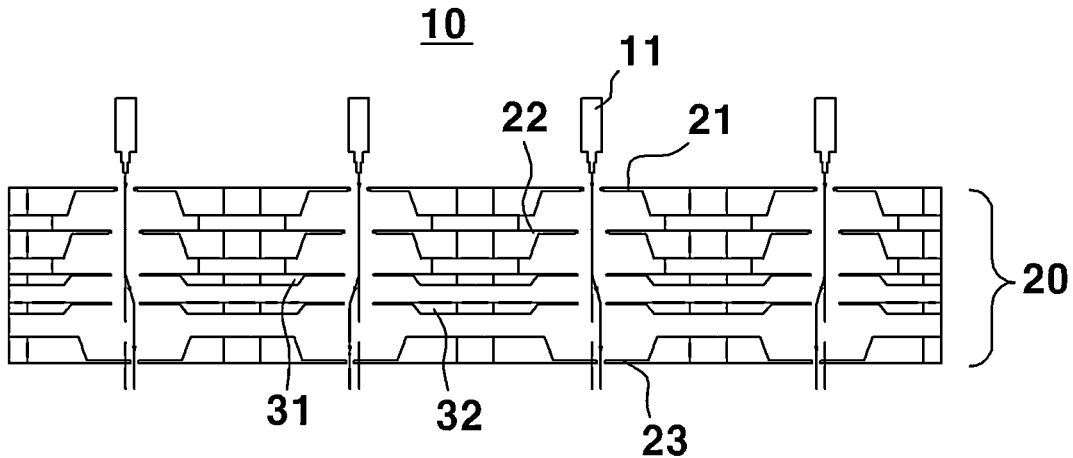
FIG. 9 is a sectional view illustrating a multiple particle beam column having aligner layers according to another embodiment of the present invention.
Figure 10:
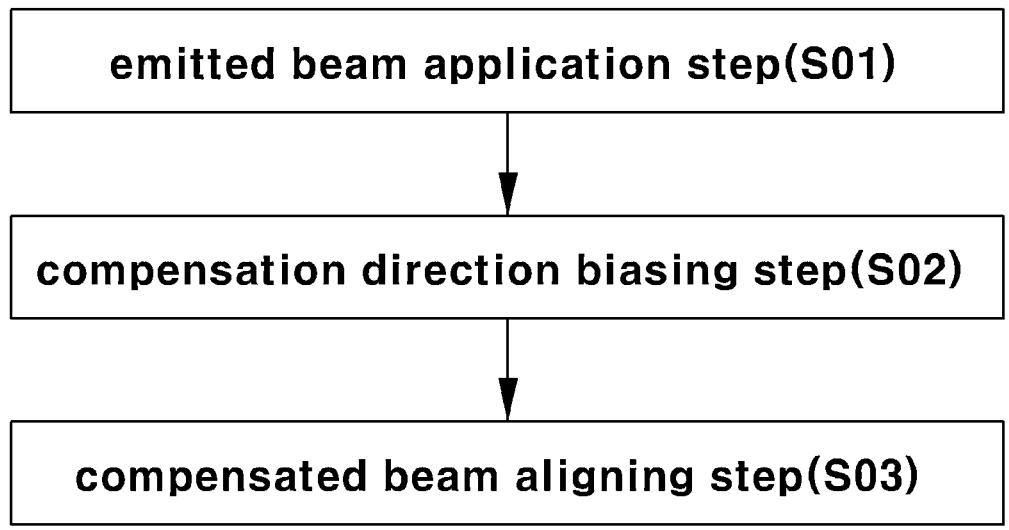
FIG. 10 is a flowchart showing a method of compensating for the path of a particle beam using a particle beam column having aligner layers according to an embodiment of the present invention.

As shown in FIG. 9, the microcolumn 10 having the double aligner according to the present invention may have a multi-microcolumn structure.

As such, the microcolumn according to present invention may be a singular microcolumn which includes a single particle beam emitting source and lenses for controlling a particle beam, as shown in FIGS. 2 and 3. Alternatively, the microcolumn according to present invention may be a multiple microcolumn which includes a plurality of particle beam emitting sources and lenses for controlling a plurality of particle beams, as shown in FIG. 9.

Meanwhile, including the source lens 20 having the two or more aligner layers, the microcolumn according to the present invention further includes at least one deflector 40 which scans the particle beam, and a focus lens 50 which focuses the particle beam onto the specimen.

FIGS. 4 through 8 illustrates an embodiment in which two deflectors 40 are provided between the source lens 20 and the focus lens 50 to make the scanning operation of the particle beam reliable.

Furthermore, in the microcolumn 10 with the double aligner according to the present invention, the double aligner may be provided in the source lens 20 or, alternatively, in the focus lens 50.

The path of the particle beam that passes through the source lens 20 or the focus lens 50 is compensated for by the double aligner layers.

Hereinafter, a method for compensating for a path of a particle beam in the microcolumn 10 with the double aligner according to the present invention will be explained in detail.

The method includes an emitted beam application step S01 of applying a particle beam into the source lens 20 including the two or more aligner layers and the limiting aperture 23. In detail, the particle beam (as needed, in the case of the electronic column, it may be an electron beam, and in the case of the ion beam column, it may be an ion beam) is emitted from the particle beam emitting source 11. The emitted particle beam enters the source lens 20 through the extractor 21 of the source lens 20. The particle beam is accelerated by the accelerator 22 before passing through the limiting aperture 23.

The method further includes a compensation direction biasing step S02 of biasing the particle beam towards the axis of the compensated path between the accelerator 22 and the limiting aperture 23 using the first aligner layer 31 of the two or more aligner layers.

That is, at the compensation direction biasing step S02, in the case where the axis of the aperture 231 of the limiting aperture 23 is spaced apart from the axis of the original path of the particle beam injected into the source lens 20, the particle beam that is moving along the axis of the original path is biased by the first aligner layer 31 towards the axis of the aperture 231, that is, towards the axis of the compensated path.

The method further includes a compensated beam alignment step S03 of aligning the particle beam that has passed through the first aligner layer 31 with the axis of the aperture 231 of the limiting aperture 23 using the second aligner layer 32 of the two or more aligner layers.

In detail, at the compensated beam alignment step S03, the particle beam, which is being biased towards the compensated path from the axis of the original path of the particle beam that is spaced apart from the axis of the aperture 231 of the limiting aperture 23, is aligned with the axis of the aperture 231 by the second aligner layer 32, thus forming the compensated path. As a result, the particle beam, the path of which is compensated for, can correctly pass through the aperture 231 of the limiting aperture 23.

Thereafter, as show in FIGS. 4 through 8, scanning of the particle beam is adjusted while passing through the deflectors such that the particle beam can be radiated onto the specimen. The particle beam is subsequently focused on the specimen by the focus lens before being radiated onto the specimen.

In this embodiment, each deflector includes a plurality of pieces (eight pieces in the embodiment of the drawings) which function to adjust a scan area of the particle beam. The focus lens 50 makes the particle beam be correctly focused on the specimen.

Detailed embodiments of the microcolumn 10 with the double aligner according to the present invention will be described with reference to the attached drawings.

FIGS. 2 and 3 shows conditions in which a particle beam emitted from the particle beam emitting source 11 enters the source lens 20 of the microcolumn 10 with the double aligner according to the present invention. The particle beam emitted from the particle beam emitting source 11 enters the source lens 20 through the extractor 21 of the source lens 20. The particle beam is accelerated by the accelerator 22 and then biased towards the compensated path by the first aligner layer 31. The particle beam that has been biased towards the compensated path is aligned with the axis of the aperture 231 of the limiting aperture 23 by the second aligner layer 32. As a result, the particle beam can correctly pass through the aperture 231 of the limiting aperture 23.

Figure 4:
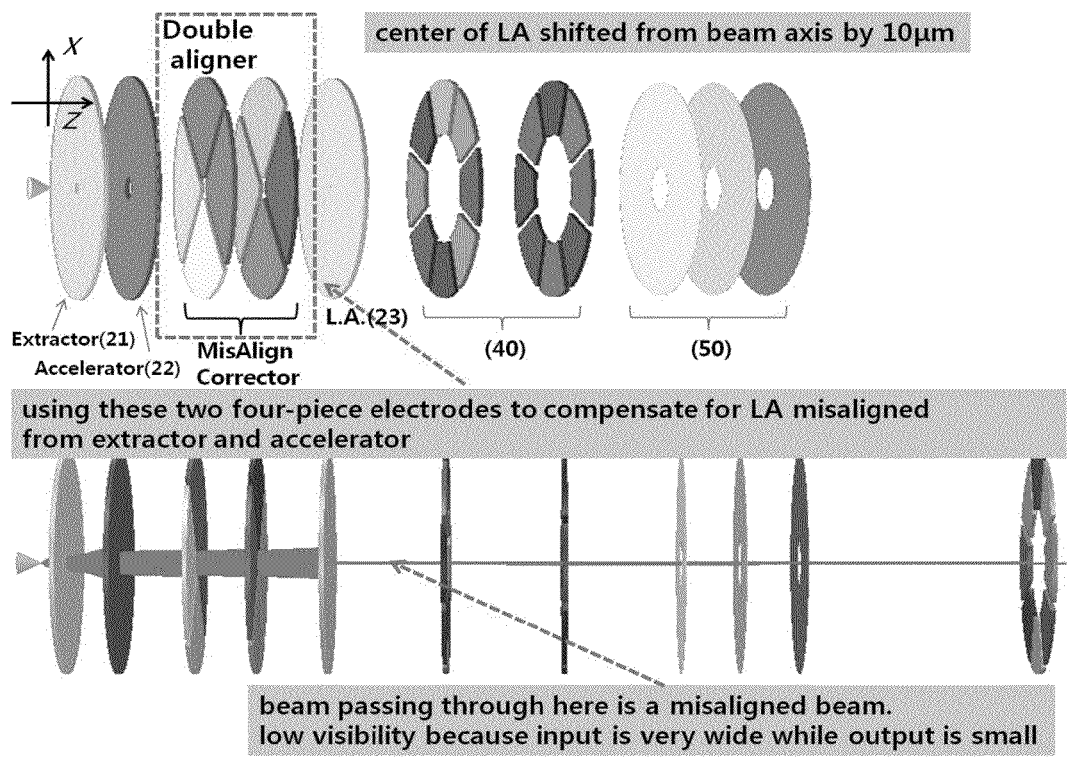
FIG. 4 is a view illustrating the construction of the particle beam column having the aligner layers according to the present invention.

FIG. 4 shows an embodiment of the present invention in which the two deflectors 40 and the focus lens 50 are provided in the microcolumn 10 that includes the particle beam emitting source 11 and the source lens 20.

Figure 5:
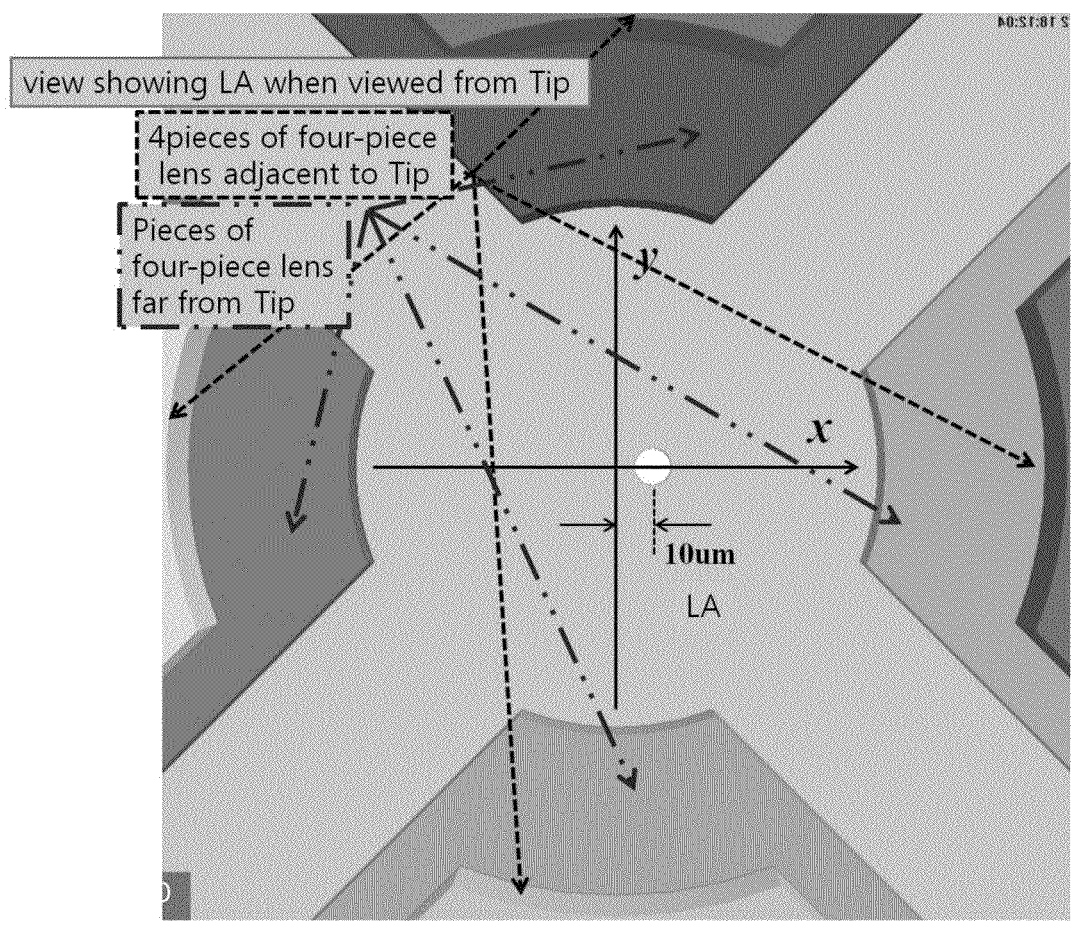
FIG. 5 is a view showing the particle beam column having the aligner layers when viewed from a particle beam emitting source side along a longitudinal axis according to present invention.

FIG. 5 is a view showing the structure of the source lens 20 with the double aligner when viewed from the particle beam emitting source 11. In FIG. 5, the aperture of the limiting aperture 23 is disposed at a position spaced apart from the original path of the particle beam emitted from the source lens 20 by a predetermined distance (in the case of FIG. 5, 10 μm).

Therefore, in this case, the path of the particle beam must be compensated for by the first aligner layer, the second aligner layer, etc.

Figure 6:
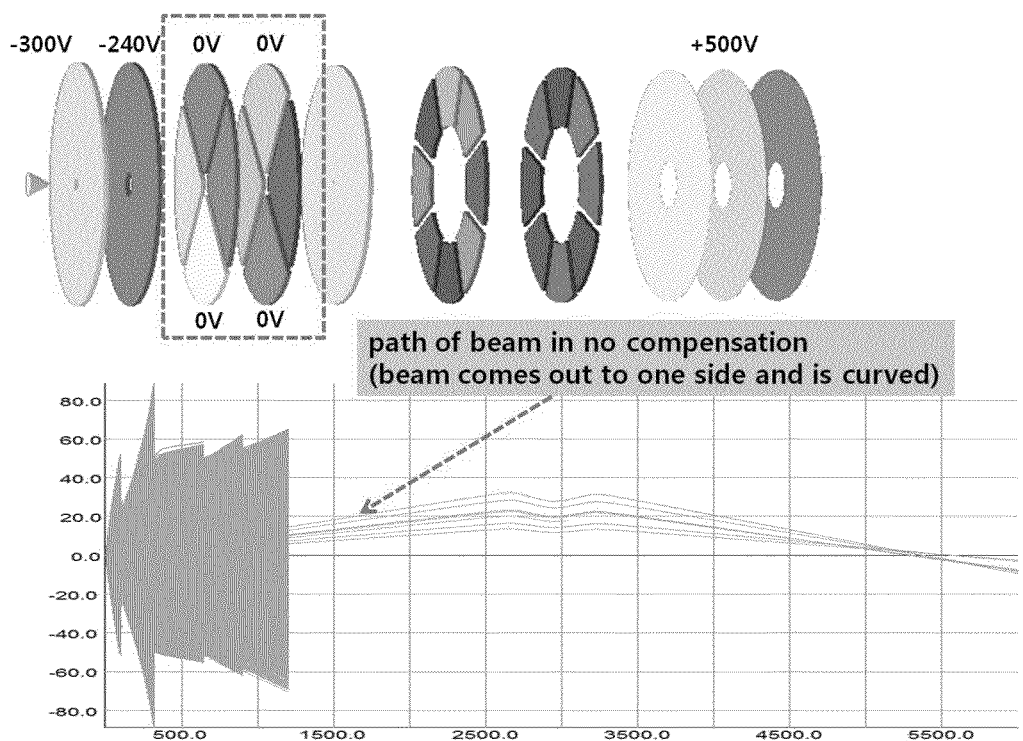
FIG. 6 is a view showing the aligner layers of the particle beam column when no voltage is applied thereto according to the present invention.
Figure 7:
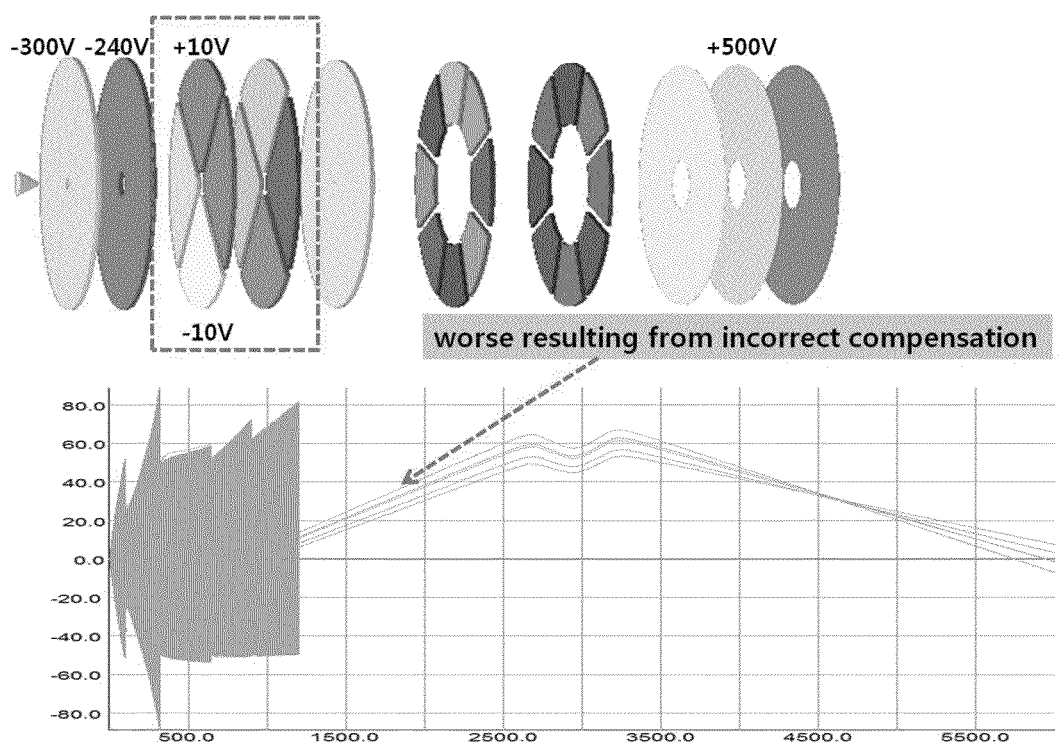
FIG. 7 is a view showing the aligner layers of the particle beam column when voltage is incorrectly applied thereto according to the present invention.
Figure 8:
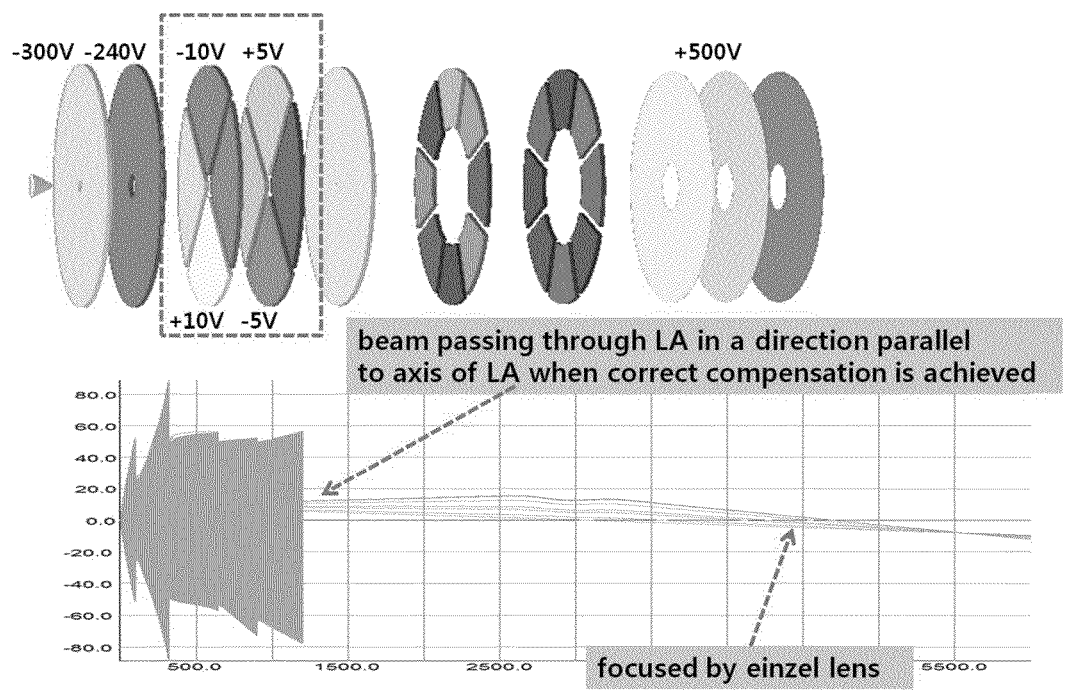
FIG. 8 is a view showing the path of a particle beam that is compensated for by the aligner layers of the particle beam column when voltage is applied thereto according to the present invention.

FIGS. 6 through 8 illustrate variation of the path of the particle beam depending on voltage applied to the double aligner (including the first aligner layer 31 and the second aligner layer 32) of the microcolumn provided with the extractor 21, the accelerator 22 and the limiting aperture 23. The values of voltage stated on the drawings are just exemplary to illustrate the embodiment of the present invention, and the spirit and scope of the present invention are not limited to the above values. The values of voltage can be appropriately changed depending on conditions of the double aligner and the microcolumn. Furthermore, in FIGS. 6 through 8, although the case where an electron beam is used as the particle beam is illustrated as a representative example, examples using other kinds of beams such as an ion beam, etc. can also be embodied by using appropriate voltages.

FIG. 6 shows the case where no voltage is applied to the double aligner under conditions in which the axis of the aperture 231 of the limiting aperture 23 is displaced from the original path of the particle beam by the extractor 21 and the accelerator 22. In this case, as shown in the bottom of FIG. 6, the path of the particle beam is curved upwards.

FIG. 7 shows the case where the aperture 231 of the limiting aperture 23 is displaced upwards from the original path of the particle beam, and positive voltage is applied to an upper aligner layer piece of the first aligner layer 31 which is at the front side of the microcolumn, while negative voltage is applied to a lower aligner layer piece. In this case, the path of the particle beam (electron beam) is more greatly curved upwards, as shown in FIG. 7.

On the other hand, FIG. 8 shows the case where voltage appropriate to compensate for the path of the particle beam is applied to the aligner layer pieces so that the compensated path of the particle beam can be aligned with the axis of the aperture 231 of the limiting aperture 23. That is, negative voltage is applied to the upper aligner layer piece of the first aligner layer 31, and positive voltage is applied to the lower aligner layer piece, whereby the particle beam (electron beam) can be biased to the compensated path. Also, positive voltage is applied to an upper aligner layer piece of the second aligner layer 32 which is at the rear side of the microcolumn, and negative voltage is applied to a lower aligner layer piece, whereby the path of the particle beam can be aligned with the axis of the aperture of the limiting aperture 23.

Thereby, as shown in the bottom of FIG. 8, the particle beam (electron beam) can travel through the aperture of the limiting aperture 23 in a direction parallel to the direction in which the lenses of the microcolumn are aligned with each other.

As described above, in the microcolumn 10 with the double aligner according to the present invention, the path of the incident beam (particle beam) injected into the source lens is compensated for so that the particle beam can pass through the aperture 231 of the limiting aperture 23. The double aligner is used to effectively compensate for the path of the particle beam, whereby the particle beam can be optimally radiated onto the specimen S.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A particle beam column comprising a source lens,
wherein the source lens comprises at least two aligner layers each consisting of a plurality of aligner layer pieces compensating for a path of a particle beam, and the plurality of aligner layer pieces are discrete pieces separated from one another by a distance,
wherein the source lens comprises a limiting aperture having an aperture, and
the path of the particle beam is compensated for by the at least two aligner layers so that the particle beam is moved into an aperture of the limiting aperture that has been misaligned from an axis of the path of the particle beam injected into the source lens.

2. The particle beam column as set forth claim 1, wherein the source lens comprises an extractor and an accelerator,
wherein at least one of the extractor and the accelerator of the source lens is formed of at least one of the at least two aligner layers.

3. The particle beam column as set forth claim 1, comprising
a single particle beam column having: a particle beam emitting source; and a plurality of lenses controlling a particle beam, or
a multi particle beam column having: a plurality of particle beam emitting sources; and a plurality of lenses controlling a plurality of particle beams,
the particle beam column comprising:
the source lens comprising the at least two aligner layers;
a deflector scanning the particle beam; and
a focus lens focusing the particle beam on a specimen.

4. The particle beam column as set forth claim 2, comprising
a single particle beam column having: a particle beam emitting source; and a plurality of lenses controlling a particle beam, or
a multi particle beam column having: a plurality of particle beam emitting sources; and a plurality of lenses controlling a plurality of particle beams,
the particle beam column comprising:
the source lens comprising the at least two aligner layers;
a deflector scanning the particle beam; and
a focus lens focusing the particle beam on a specimen.

5. A method for compensating for a path of a particle beam in a particle beam column having a source lens comprising an extractor and an accelerator and a limiting aperture, the method comprising:
applying the particle beam into the source lens comprising at least two aligner layers each consisting of a plurality of aligner layer discrete pieces separated from one another by a distance;
biasing the particle beam towards an axis of a compensated path before the limiting aperture using a first aligner layer of the at least two aligner layers; and
aligning the particle beam that has passed through the first aligner layer with an axis of an aperture of the limiting aperture using a second aligner layer of the at least two aligner layers.

6. The method as set forth claim 5,
wherein at least one of the extractor and the accelerator biases the particle beam towards an axis of the compensated path.

7. The method as set forth claim 5,
wherein at least one of the extractor and the accelerator aligns the particle beam that has passed through the first aligner layer with an axis of an aperture of the limiting aperture.

8. The method as set forth claim 6,
wherein the extractor biases the particle beam towards an axis of the compensated path, and the accelerator aligns the particle beam that has passed through the first aligner layer with an axis of an aperture of the limiting aperture.

9. The particle beam column as set forth claim 1, wherein the at least two aligner layers comprise:
a first aligner layer biasing the particle beam towards an axis of a compensated path before the limiting aperture; and
a second aligner layer aligning the biased particle beam with an axis of the aperture of the limiting aperture.

10. The particle beam column as set forth claim 1, wherein the at least two aligner layers comprise:
a first aligner layer biasing the accelerated particle beam towards an axis of a compensated path before the limiting aperture; and
a second aligner layer aligning the biased particle beam with an axis of the aperture of the limiting aperture.

* * * * *